United States Patent [19]

Maggelet et al.

[11] Patent Number: 5,214,621
[45] Date of Patent: May 25, 1993

[54] UNIVERSAL CIRCUIT BOARD HOUSING WITH A HINGED MEMBER

[75] Inventors: John Maggelet, Sussex; Robert J. Rammel, Muskego, both of Wis.

[73] Assignee: Square D Company, Palatine, Ill.

[21] Appl. No.: 850,233

[22] Filed: Mar. 11, 1992

Related U.S. Application Data

[63] Continuation of Ser. No. 630,693, Dec. 20, 1990, abandoned.

[51] Int. Cl.$^5$ ............................................. H05K 7/20
[52] U.S. Cl. ..................................... 361/383; 312/326; 361/391; 361/395
[58] Field of Search ............ 312/223, 320, 326, 348.1, 312/348.2, 327, 333; 292/44, 49, 53; 211/41; 361/340, 380, 382, 383, 390–395, 399, 415, 424, 429, 428

[56] References Cited

U.S. PATENT DOCUMENTS 4,501,368  2/1985  Gill .......................................... 211/41
4,716,497  12/1987  Craker .................................. 361/395
4,931,909  6/1990  Backes .................................. 361/399

Primary Examiner—Gerald P. Tolin
Attorney, Agent, or Firm—Larry I. Golden; Michael J. Femal; Richard J. Graefe

[57] ABSTRACT

A housing is used for enclosing a circuit board of the type used in programmable logic controllers. Through the use of an adapter plate, the housing can accommodate a wide variety of circuit boards that have multiple input/output components that must be accessible to the outside of the housing. A hinged side wall provides easy access to the circuit board and the components on it and slots on the top and bottom of the housing provide venting for cooling the components.

6 Claims, 6 Drawing Sheets

5,214,621

UNIVERSAL CIRCUIT BOARD HOUSING WITH A HINGED MEMBER

This application is a continuation of application Ser. No. 07/630,693, filed on Dec. 20, 1990, now abandoned.

FIELD OF THE INVENTION

Applicant's invention relates generally to electrical control mechanisms and more particularly to a housing adaptable for use with a variety of different circuit boards that perform a number of control functions.

RELATED APPLICATIONS

This application is related to commonly-assigned granted patent to Maggelet et al., U.S. Pat. No. 4,956,750, issued Sep. 11, 1990, entitled "A Register Rack Assembly for a Programmable Controller System", the specifications of which are expressly incorporated herein.

BACKGROUND OF THE INVENTION

Circuit boards supporting a plurality of interconnected electric components to perform a variety of control functions are well known. In many instances, a plurality of such circuit boards are electrically interconnected to form programmable logic controllers (PLCs) that are normally used to control a number of functions in a manufacturing operation. These programmable logic controllers are often of necessity located on the plant floor and thus are subject to considerable abuse.

The circuit boards are made of a non-metallic material and are normally mounted in a sturdy housing. The circuit boards typically have various input/output devices which must be outwardly exposed to permit operator monitoring and/or actuation. For example, circuit boards of this type can have a key switch control, terminal blocks, and a plurality of light emitting diodes (LEDs) that are outwardly exposed through windows formed in the housing wall. The key switch control provides secured operation of the PLC. The terminal blocks are used for field wiring of sensors and actuators. The LEDs provide a visual indication of the operation of the circuit board. In addition, the circuit boards can have communication ports for coupling the circuit boards to other equipment. The communication ports are also exposed through windows formed with the housing wall. Because of the numerous types of circuit boards, it becomes necessary to supply a plurality of modules housings to accommodate the wide variety of the outwardly exposed input/output components.

It is also well known that the circuit boards require frequent replacement when a malfunction occurs. Since a malfunction of necessity shuts down the machine operation, replacement must be made in a minimum amount of time.

The present invention provides a simplified housing construction which easily accommodates the different types of circuit boards and also provides a novel cover which can be opened quickly to gain access to the electrical components on the circuit board.

SUMMARY OF THE INVENTION

According to the present invention, the circuit board housing has a base or bottom wall, side walls, a front wall and a top wall segment that cooperate to define a rearwardly opening channel. The front wall has an opening for mounting an adapter plate. The adapter plate can have a plurality of windows or openings for exposing a plurality of input/output devices that may be present on the circuit board. The front wall has further openings at the top for exposing a multitude of LEDs that may also be present on the circuit board.

The left side wall has press-fit metal standoffs that are strategically spaced. The circuit board has mounting holes that respectively engage the metal standoffs to provide a reliable and secure mounting means of the circuit board to the housing. The right side wall is hinged to the bottom wall and is secured to the rest of the housing by three fasteners after the circuit board has been mounted.

According to one aspect of the invention, the adapter plate has a first opening which receives the key switch control and a second opening which receives a communication port. The adapter plate includes a tab which is received under an edge of the top of the opening in the front wall and is retained at the bottom of the opening by a single fastener. A label with prepunched openings for LEDs, if so required, is applied to the top portion of the front wall to complete the assembly.

DESCRIPTION OF THE PREFERRED EMBODIMENT

Figure 1:
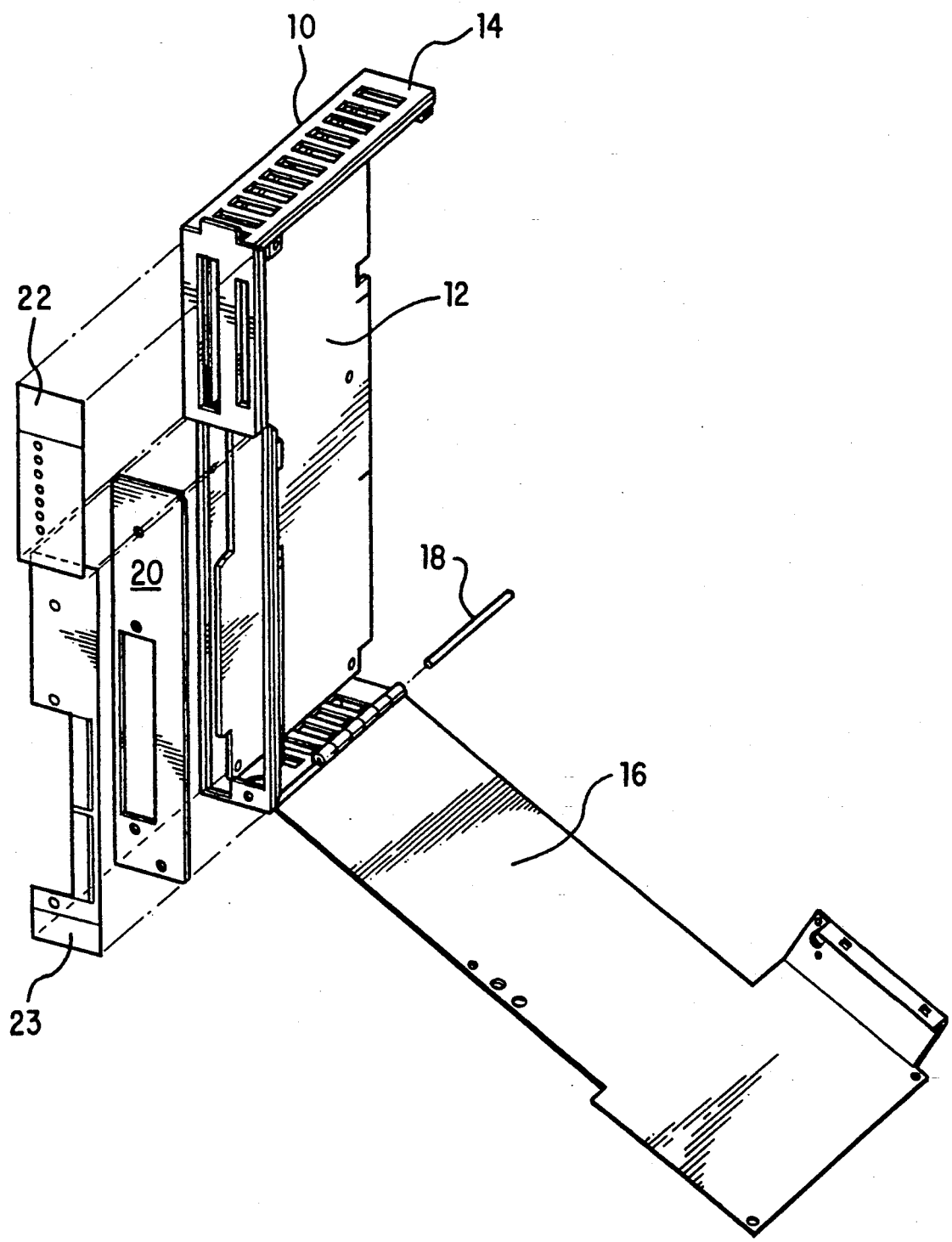
FIG. 1 is an exploded perspective view of the housing for a circuit board constructed in accordance with the teachings of the present invention.

Referring to FIG. 1 of the drawings, a housing 10 encloses a circuit board 12 of the type used in a typical programmable logic controller system. The housing 10 includes, a left side wall 14 and a right side wall 16 that is hinged to the left side wall 14 by a pin 18 to be described in greater detail later. An adapter plate 20 closes the lower portion of the left side wall 14 and a nameplate 22 closes the upper portion of the left side wall 14. A nameplate 23 covers the adapter plate and provides identification of the various input/output devices mounted on the circuit board 12. The details of the left side wall 14 and the right side wall 16 will be described next.

Figure 2:
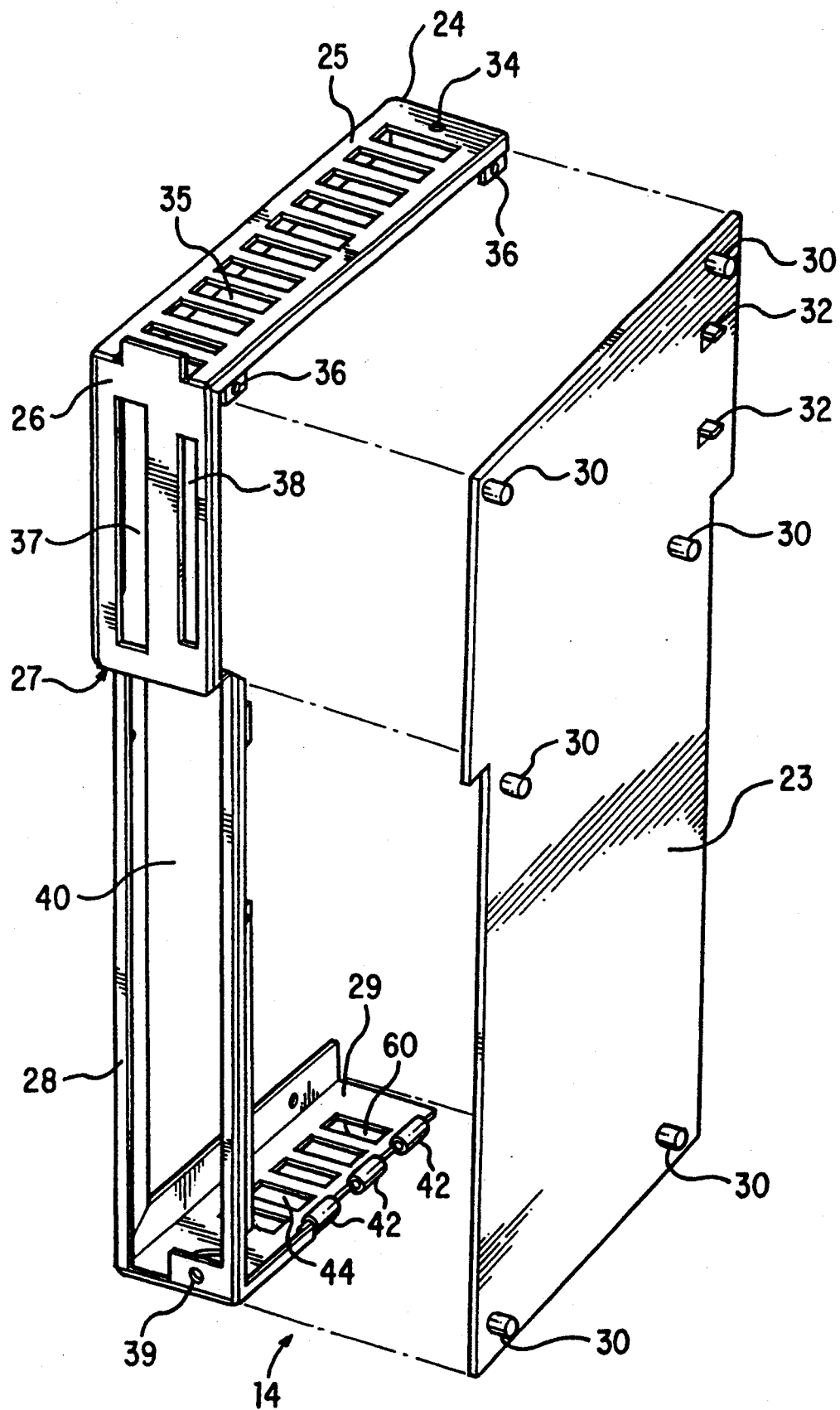
FIG. 2 is a side view of the left side wall, front wall, top wall, and bottom wall.

Referring now to FIG. 2, the left side wall 14 consists of a back side 23 that forms the left side of the housing 10 and a formed U-shaped channel 24 that is blind spot-welded to the back side 23. The formed U-shaped channel 24 has a top wall segment 25, a top front wall segment 26, an offset 27, a bottom front wall segment 28 and a bottom wall segment 29. Six metal standoffs 30 that are used for supporting circuit board 12 are press-fit into the back side 23. Two locating tabs 32 connected to the backside 23 provide means for aligning the right side wall 16 to the left side wall 14 when the left side wall 14 swings into final assembled state. Top wall segment 25 has mounting hole 34 which provides a means to secure the completed housing 10 in its final environment which will be described later. Slots 35 provide venting means to cool components that are located on circuit board 12. Mounting holes 36 located on top wall segment 25, top front wall segment 26 and bottom front wall 28 accept the fastener that secures the right side wall 16 to the left side wall 14. Slots 37 and 38 of top front segment 26 provide openings for LED indicators that may be present on circuit board 12. Unused positions would be covered by nameplate 22 in final assembly. Offset 27 accepts a top end 72 (FIG. 5) of adapter plate 20 and mounting hole 39 accepts a screw type fastener to secure the adapter plate 20 to the housing 10. Opening 40 accommodates a multitude of different input/output devices. Three tabs 42 of bottom segment 29 are cylindrically formed to define one half of a hinged member to mate with a similar portion of right side wall 16. Slots 44 provide intake air for cooling the components on the circuit board 12.

Figure 3:
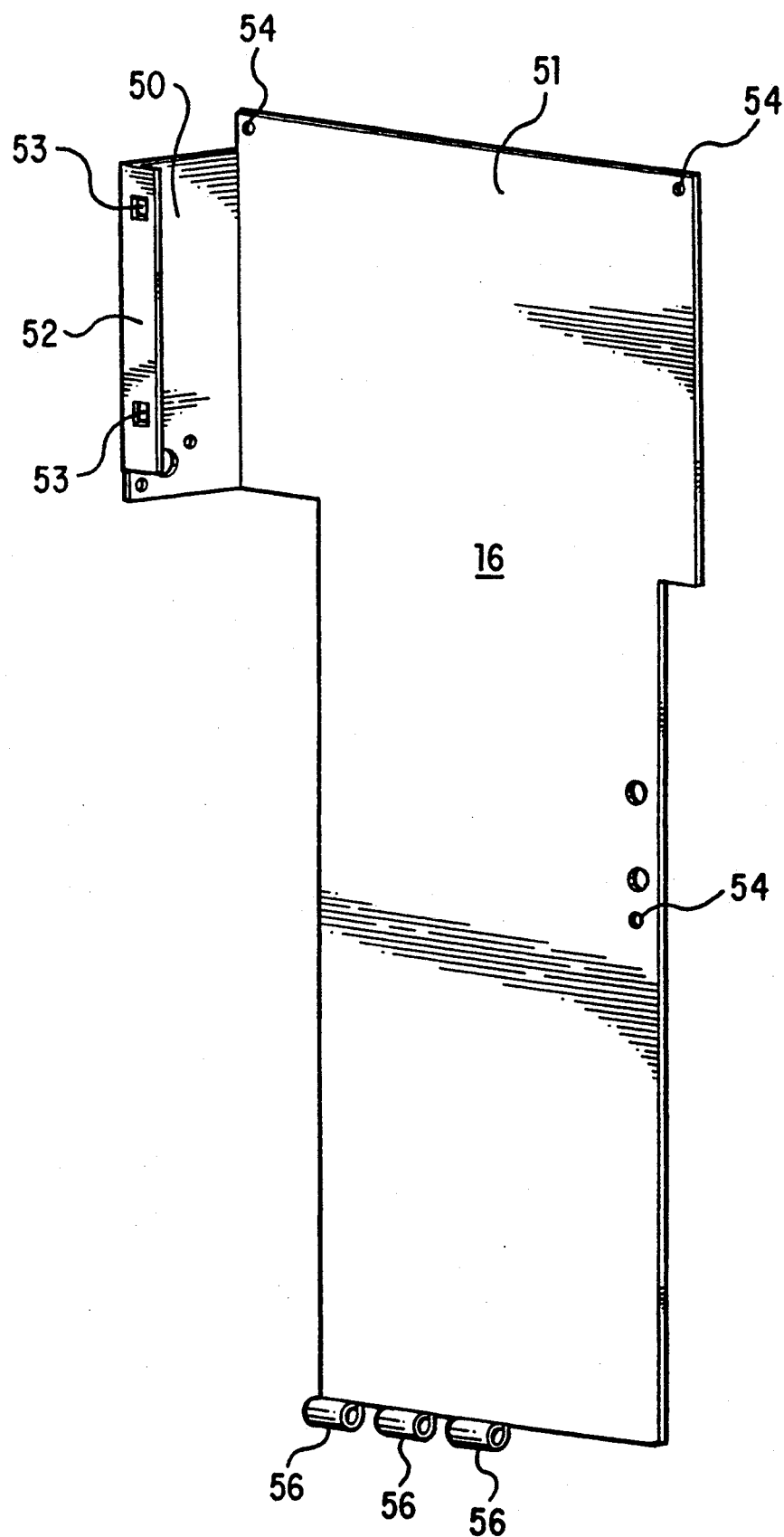
FIG. 3 is a side view of the hinged right side wall.

FIG. 3 is a detailed side view of right side wall 16. Segment 50 is perpendicular to a section 51 and forms the rear segment of housing 10. A flange 52 has two rectangular openings 53 that are positioned to accept tabs 32 of left side wall 14 in final assembly. Holes 54 line up with holes 36 of left side wall 14. Three tabs 56 are cylindrically formed to define the other half of a hinged joint to mate with tabs 42 of left side wall 14.

Figure 4:
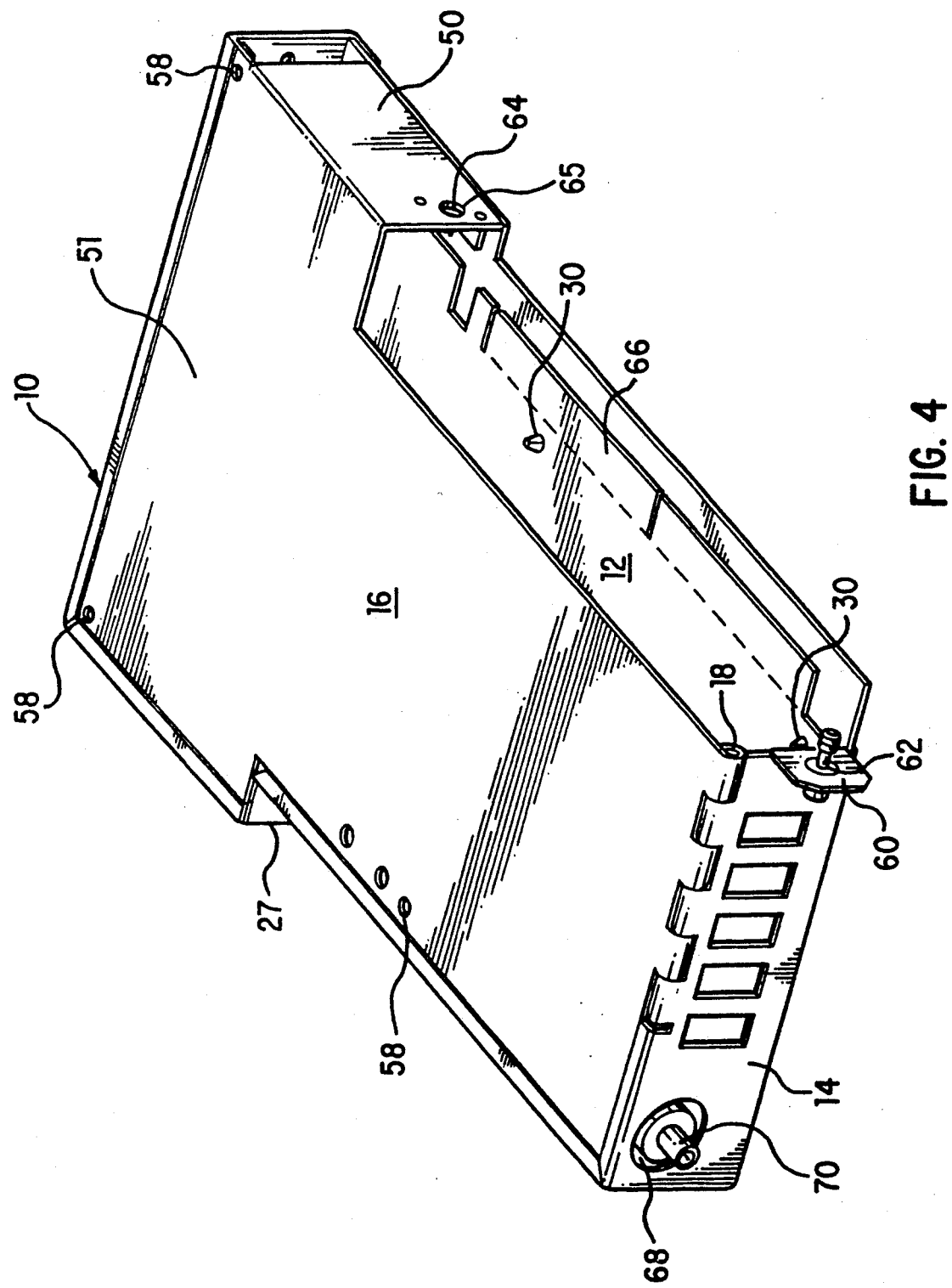
FIG. 4 is a side view of the housing showing details of the rearwardly opening channel.

In addition to the pin 18, the right side wall 16 is attached to the left side wall 14 by three mounting screws 58 through holes 36 and 54 respectively, after the circuit board 12 is secured to the left side wall 14 by metal mounting standoffs 30 as illustrated by FIG. 4. Hole 62 of a downward extending tab 60 accepts a screw for securing the housing 10 into a rack assembly (not shown) of the type in commonly-assigned, granted patent to Maggelet et al., U.S. Pat. No. 4,956,750, issued Sep. 11, 1990,. entitled "A Register Rack Assembly for a Programmable Controller System" A ball clip connector 64 (not shown) is mounted next to hole 64 of segment 50 and is positioned to accept a part of the rack assembly for further securing and alignment of the housing 10 to the rack assembly. Edge 66 of circuit board 12 contains the conductive patterns that mate with a commonly obtained and recognized edge connector in the rack assembly which allows the housing 10 to be electrically interconnected with other similar housings to form a programmable logic controller. Opening 68 of the left side wall 14 provides clearance for a communication connector 70 that maybe mounted on the circuit board 12.

Figure 5:
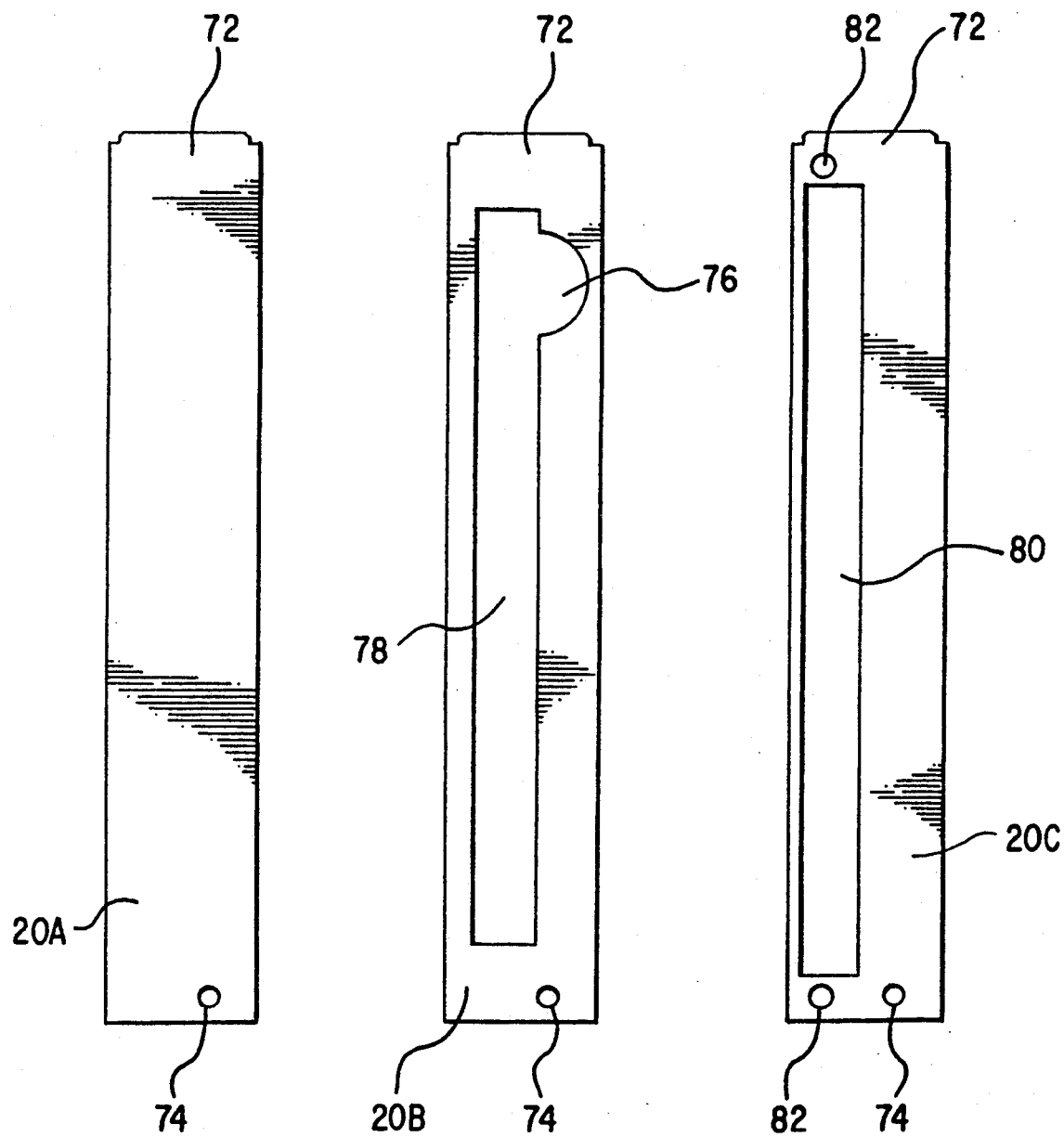
FIG. 5 is a front view of several different types of the front adapter plates.

Referring now to FIG. 5, three different types of adapter plates 20 are illustrated. For those instances where no input/output devices are present on the circuit board 12, a blank adapter plate 20A would be used. Tab 72 fits under offset 27 and hole 74 provides clearance for a screw type fastener to secure the adapter plate 20A to the lower front wall 28 through mounting hole 39. Adapter plate 20B would be used if a key switch control is a part of the housing 10. Opening 76 supports the key switch, while elongated opening 78 exposes a plurality of other input/output devices that maybe present on the circuit board 12. If a terminal block is required, adapter plate 20C would be used. Elongated opening 80 provides clearance for the terminal block and holes 82 provide the mounting holes for screw type fasteners to support the terminal block.

Figure 6A:
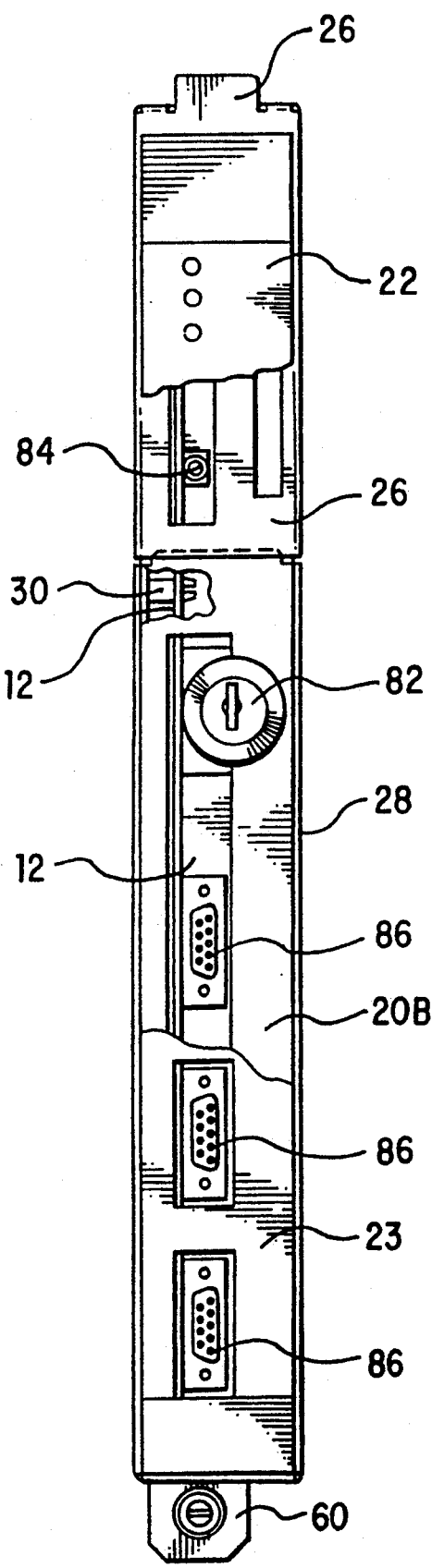
FIG. 6A is a front view and a side view with parts broken away showing the front wall of the housing
Figure 6B:
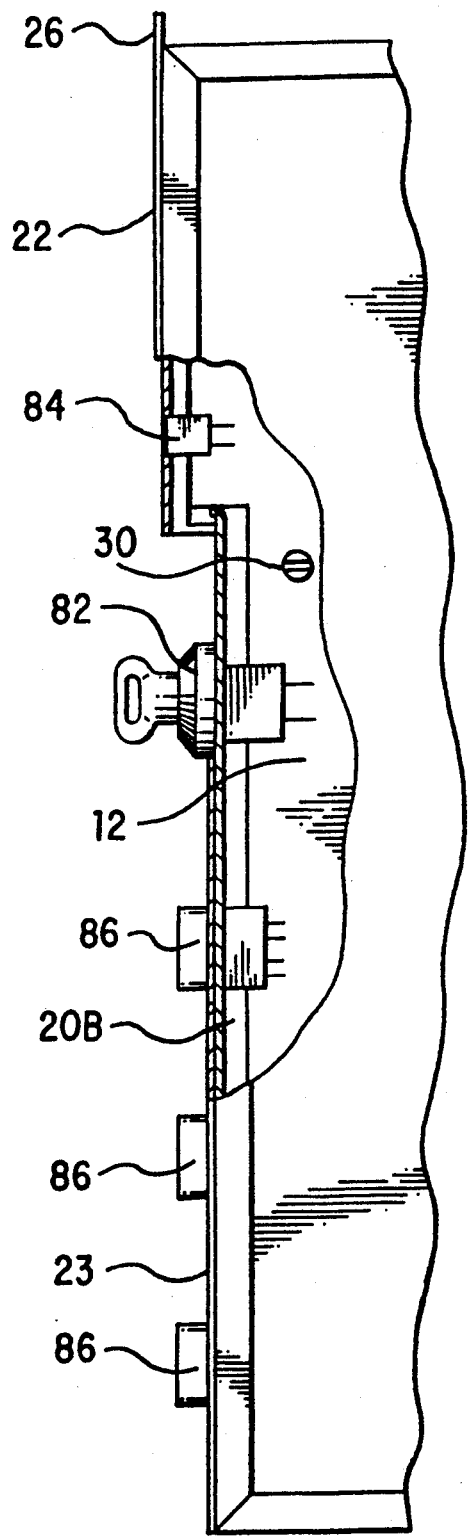
FIG. 6B is a fragmentary side view with parts broken away showing details of the various components and adapter plate illustrated in FIG. 6A.

According to one aspect of the invention, the housing is configured such that the input/output devices are a key switch 82, LEDs 84 and communication ports 86 as detailed in FIGS. 6A and 6B. Nameplate 22 covers unused portions of upper front wall 26 and nameplate 23 covers unused portions of adapter plate 20B.

While the specific embodiments have been illustrated and described, numerous modifications are possible without departing from the scope or spirit of the invention.

We claim:

1. A module housing for use in a programmable controller system, said housing enclosing a circuit board containing a plurality of combinations of outwardly extending components having predetermined shapes and functioning as input or output devices thereon, the housing comprising:
    (a) a left side wall having a base, a front wall, and a top wall, said front wall having openings for receiving said components;
    (b) a removable right side wall hingedly connected to said base of said left side wall, said right side wall having spaced slots and said left side wall having projections received into said slots so that said right side wall swings into a predetermined alignment over said left side wall;
    (c) fastener means for releasably retaining said right side wall on said left side wall;
    (d) locator means connected to said left side wall for alignably positioning the circuit board within said housing;
    (e) an adapter plate fixedly disposed on said front wall, said adapter plate having a plurality of predetermined configurations, each of said configurations accessing one of said plurality of combinations of outwardly extending components contained on said circuit board.

2. The housing of claim 1, further including:
    (a) means for maintaining alignment between said openings of said front wall and said components and said adapter plate having a plurality of windows or openings for exposing a plurality of said components;
    (b) a label disposed on said front wall, said label adaptable for identifying a plurality of indicator light emitting diodes; and
    (c) a nameplate disposed on said adapter plate.

3. The housing as defined in claim 1 wherein said right side wall functions as a door for quick access for removal of said circuit board or of said components on said circuit board.

4. The housing as defined in claim 1 wherein said front wall has a top segment and a bottom segment, and wherein said adapter plate engages said top segment and is secured to said bottom segment, said adapter plate having a plurality of windows therein for exposing said input/output devices.

5. The housing as defined in claim 1, wherein said top wall and said base of said left side wall have openings for cooling said components on said circuit board.

6. A housing containing a circuit board, the circuit board having a plurality of input/output component combinations thereon, said housing including a bottom wall, right and left side walls, a front wall, and a top wall segment extending from an upper edge of said front wall and cooperating therewith to form a rearwardly opening channel, said circuit board secured to said left side wall, said right side wall hingedly connected to said bottom wall allowing a means of accessibility to said circuit board, said front wall having a plurality of windows therein exposing said input/output component combinations, said front wall further having attached thereto one of a plurality of adapter plates mounted over one of said windows, said one adapter plate accessing said plurality of input/output component combinations, said rearwardly opening channel exposing an edge of said circuit board, said edge having a means for interconnecting to circuit boards within other housings through a common bus system.

* * * * *